United States Patent [19]

Hladovcak

[11] Patent Number: 5,386,641
[45] Date of Patent: Feb. 7, 1995

[54] TAPING ALIGNMENT TOOL FOR PRINTED CIRCUIT BOARDS

[75] Inventor: Raymond C. Hladovcak, Seneca, Ill.

[73] Assignee: AT&T Corp., Murray Hill, N.J.

[21] Appl. No.: 144,595

[22] Filed: Oct. 28, 1993

[51] Int. Cl.[6] .............................................. B25H 7/00
[52] U.S. Cl. ........................................ 33/645; 33/562
[58] Field of Search ................. 33/613, 614, 623, 645, 33/562, 566, 18.1

[56] References Cited

U.S. PATENT DOCUMENTS 3,928,692 12/1975 Pellegrino ............................. 428/54
5,222,305 6/1993 Guth ..................................... 33/614

FOREIGN PATENT DOCUMENTS 2229391 9/1990 United Kingdom .................. 33/562

*Primary Examiner*—Alvin Wirthlin

[57] ABSTRACT

A taping alignment tool for aligning tape on a printed circuit board having a set of finger connectors and two aligning holes adjacent the set of finger connectors, the taping alignment tool including a base having a first surface; a tape alignment and cutting member mounted on the first surface of the base and including a base leg for mounting the tape alignment and cutting member on the base, and an extension leg extending from the base leg in spaced relation above the first surface of the base, for forming a groove between the extension leg and the first surface of the base to receive the set of finger connectors of the printed circuit board therein, the extension leg having an exposed surface with a knife guide therein for guiding a knife to cut a tape applied on the printed circuit board and the extension leg in a pattern around the set of finger connectors, and the knife guide including stepped cut-away portions of the exposed surface of the extension leg for forming opposite side edge knife guides and a lower edge knife guide; securing screws for securing the base leg on the first surface of the base; and spring-loaded pin assemblies for engaging with aligning holes of the printed circuit board so as to align the printed circuit board in the groove, the pin assemblies being mounted in the base so as to extend through the first surface into the groove.

28 Claims, 3 Drawing Sheets

TAPING ALIGNMENT TOOL FOR PRINTED CIRCUIT BOARDS

BACKGROUND OF THE INVENTION

The present invention relates generally to plating of finger connectors of printed circuit boards, and more particularly, is directed to a tool for aligning tape on a printed circuit board to facilitate such plating.

As is well known, printed circuit boards include a circuit wiring pattern printed thereon, with the circuit wiring pattern being electrically connected to circuit components mounted on the printed circuit boards. In addition, printed circuit boards have peripherally located finger connectors for inputting signals to, and for outputting signals from, the circuit wiring pattern.

Because the printed circuit board is attached to and removed from different connections, there is often repeated connection and disconnection of the finger connectors to external connections. Because of the need for better electrical connectability and the requirement for low contact resistance, the finger connectors are coated with a noble element, such as a gold alloy. An example of such a gold alloy that is used is a cobalt-gold alloy. Further, such gold alloy prevents corrosion of the finger connectors, and therefore, prevent oxidation of the finger connectors.

Therefore, when plating the finger connectors with the gold alloy, it is necessary to provide a mask for the printed circuit board so that the gold alloy is applied only to the finger connectors. In this regard, it is know to adhere tape over the peripheral portion of the printed circuit board, except over that area containing the finger connectors.

Although there presently exist taping machines, these machines cannot accurately align tape on printed circuit boards for several reasons. First, the tape has a tendency to stretch, so that misalignment easily occurs. Second, misalignment occurs if there is any telescoping of the tape. Accordingly, the tape adherence operation is performed manually.

However, for each set of finger connectors, three pieces of tape must be used, that is, one piece of tape below the set of finger connectors and one piece of tape on either side of the finger connectors, thereby leaving the set of finger connectors exposed. Because of this operation, alignment of the pieces of tape will vary with each set of finger connectors, and there will not always be correct alignment.

Further, this operation must be performed for both sides of each set of finger connectors of the printed circuit board. Generally, there are two sets of finger connectors on a printed circuit board. Thus, twelve pieces of tape must be used, which is wasteful and time consuming to apply.

SUMMARY OF THE INVENTION

Accordingly, it is an object of the present invention to provide a taping alignment tool for printed circuit boards that overcomes the problems with the aforementioned prior art.

It is another object of the present invention to provide a taping alignment tool for accurately aligning tape in connection with each set of finger connectors of a printed circuit board.

It is still another object of the present invention to provide a taping alignment tool for printed circuit boards that requires only one piece of tape to be use for each side of a set of finger connectors.

It is still another object of the present invention to provide a taping alignment tool for printed circuit boards that reduces the time for applying tape to the printed circuit board.

It is yet another object of the present invention to provide a taping alignment tool for printed circuit boards that is easy and economical to manufacture and use.

In accordance with an aspect of the present invention, a taping alignment tool for aligning tape on a printed circuit board having a set of finger connectors, includes a base having a first surface; a tape alignment and cutting member mounted on the first surface of the base, the tape alignment and cutting member including a base leg for mounting the tape alignment and cutting member on the base, and an extension leg extending from the base leg in spaced relation above the first surface of the base, for forming a groove between the extension leg and the first surface of the base to receive the set of finger connectors of the printed circuit board therein, the extension leg having an exposed surface with a knife guide therein for guiding a knife to cut the tape applied on the printed circuit board and the extension leg, in a pattern around the set of finger connectors; and securing screws for securing the base leg on the first surface of the base.

Specifically, the tape alignment and cutting member has a generally L-shaped configuration, with the base leg forming one leg of the L-shaped configuration and the extension leg forming another leg of the L-shaped configuration. Preferably, the extension leg extends substantially parallel to the first surface of the base and has a lower edge substantially in alignment with the lower edge of the base.

The knife guide includes cut-away portions of the exposed surface of the extension leg for forming opposite side edge knife guides and a lower edge knife guide, with the lower edge knife guide being continuously formed with the side edge knife guides. Preferably, the side edge knife guides and the lower edge knife guide are in the form of stepped surfaces.

Further, the exposed surface of the extension leg means has at least one elongated recess thereof for aiding in removal of the tape applied to the exposed surface after the tape has been cut.

In addition, the base includes an elongated opening forming a handle therein.

There is at least one aligning hole in the printed circuit board adjacent the set of finger connectors, and the taping alignment tool further includes at least one pin assembly for engaging with the at least one aligning hole of the printed circuit board so as to align the printed circuit board in the groove, each pin assembly being mounted in the base so as to extend through the first surface into the groove. Each pin assembly preferably includes a mounting housing for mounting the pin assembly in the base, a pin slidably retained within the mounting housing, and a coil spring in the mounting housing for biasing the pin partially out of the mounting housing into the groove for engagement with the at least one aligning hole. As to the mounting housing, the base includes a threaded opening, and the mounting housing includes external threads for threadedly engaging the mounting housing within the threaded opening of the base.

Preferably, there are two aligning holes in the printed circuit board, each aligning hole being adjacent a different side of the set of finger connectors; and there are two pin assemblies, each for engaging with a different one of the aligning holes.

In accordance with another aspect of the present invention, a taping alignment tool for aligning tape on a printed circuit board having a set of finger connectors and at least one aligning hole adjacent the set of finger connectors, includes a base having a first surface; a tape alignment and cutting member mounted on the first surface of the base, the tape alignment and cutting member including a base leg for mounting the tape alignment and cutting member on the base, and an extension leg extending from the base leg in spaced relation above the first surface of the base, for forming a groove between the extension leg and the first surface of the base to receive the set of finger connectors of the printed circuit board therein, the extension leg having an exposed surface with a knife guide therein for guiding a knife to cut the tape applied on the printed circuit board and the extension leg, in a pattern around the set of finger connectors, and the knife guide including cut-away portions of the exposed surface of the extension leg for forming opposite side edge knife guides and a lower edge knife guide; securing screws for securing the base leg on the first surface of the base; and at least one pin assembly for engaging with the at least one aligning hole of the printed circuit board so as to align the printed circuit board in the groove, each pin assembly being mounted in the base so as to extend through the first surface into the groove.

In accordance with another aspect of the present invention, a taping alignment tool for aligning tape on a printed circuit board having a set of finger connectors and first and second aligning holes adjacent the set of finger connectors at opposite sides thereof, includes a base having a first surface; a tape alignment and cutting member mounted on the first surface of the base, the tape alignment and cutting member including a base leg for mounting the tape alignment and cutting member on the base, an extension leg extending from the base leg in substantially parallel, spaced relation above the first surface of the base, for forming a groove between the extension leg and the first surface of the base to receive the set of finger connectors of the printed circuit board therein, the extension leg having an exposed surface with a knife guide therein for guiding a knife to cut the tape applied on the printed circuit board and the extension leg, in a pattern around the set of finger connectors, and the knife guide including cut-away portions of the exposed surface of the extension leg for forming opposite side edge knife guides and a lower edge knife guide, with the lower edge knife guide being continuously formed with the side edge knife guides, and the exposed surface of the extension leg has at least one elongated recess thereof for aiding in removal of the tape from the exposed surface after the tape has been cut, and the tape alignment and cutting member has a generally L-shaped configuration, with the base leg forming one leg of the L-shaped configuration and the extension leg forming another leg of the L-shaped configuration; securing screws for securing the base leg on the first surface of the base; and first and second pin assemblies for engaging with the first and second aligning holes, respectively, of the printed circuit board so as to align the printed circuit board in the groove, each pin assembly being mounted in the base so as to extend through the first surface into the groove, each pin assembly including a mounting housing for mounting the pin assembly in the base, a pin slidably retained within the mounting housing, and a coil spring in the mounting housing for biasing the pin partially out of the mounting housing into the groove for engagement with a respective aligning hole.

The above and other objects, features and advantages of the invention will become readily apparent from the following detailed description thereof which is to be read in connection with the accompanying drawings.

DESCRIPTION OF THE PREFERRED EMBODIMENTS

Figure 1:
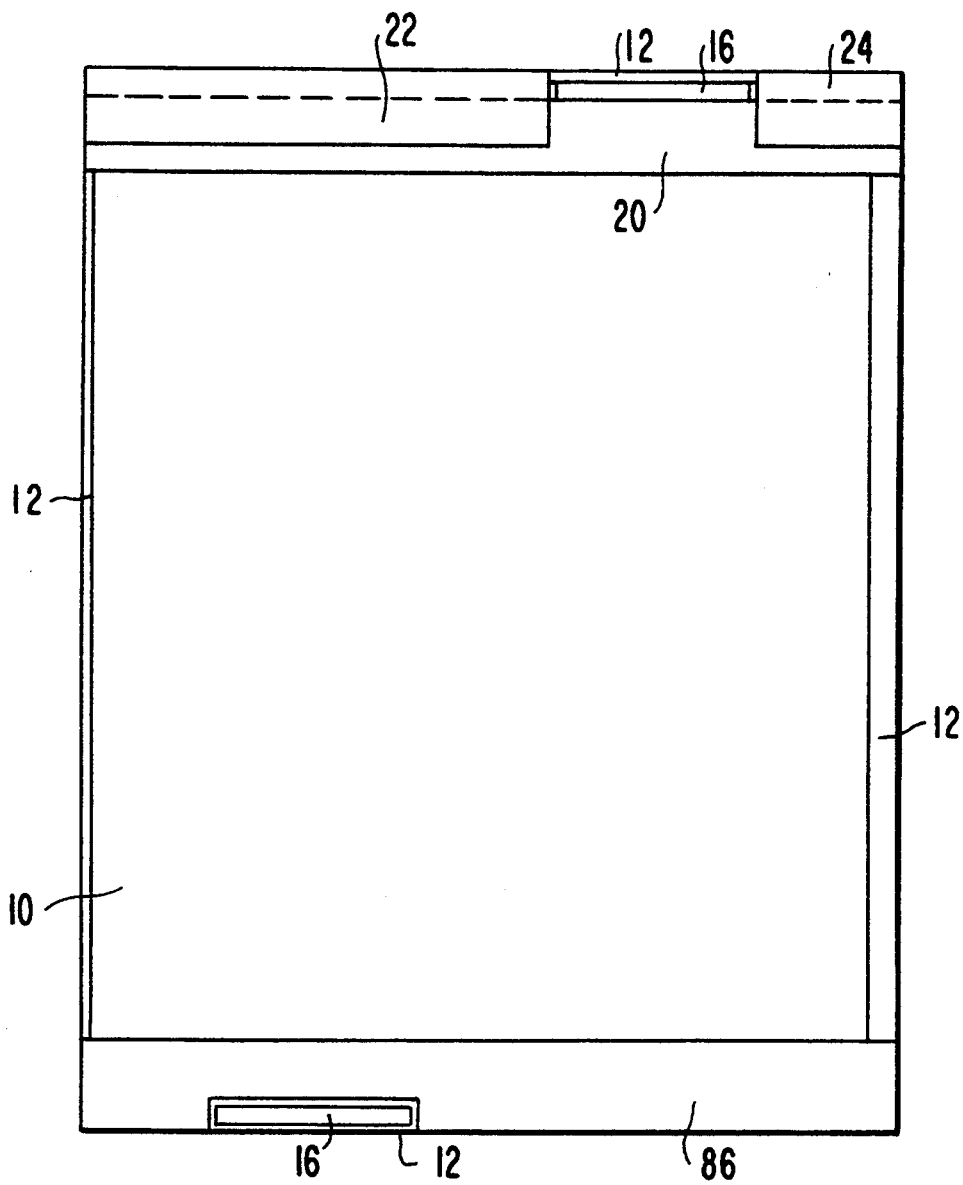
FIG. 1 is plan view of a conventional printed circuit board having tape applied at the top according to the prior art and at the bottom according to the present invention.
Figure 2:
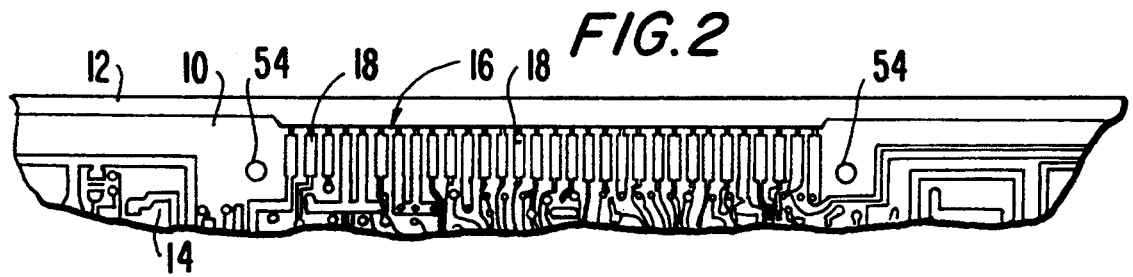
FIG. 2 is an exploded plan view of one set of finger connectors of the printed circuit board of FIG. 1.
Figure 3:
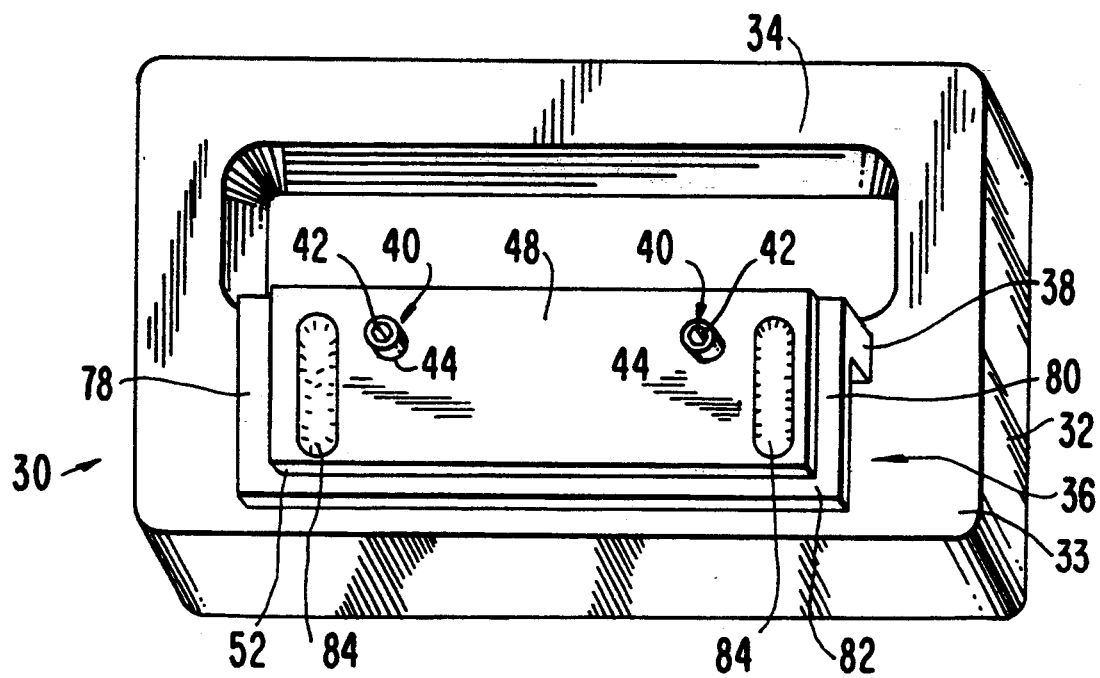
FIG. 3 is a front perspective view of a taping alignment tool for printed circuit boards according to the present invention.
Figure 4:
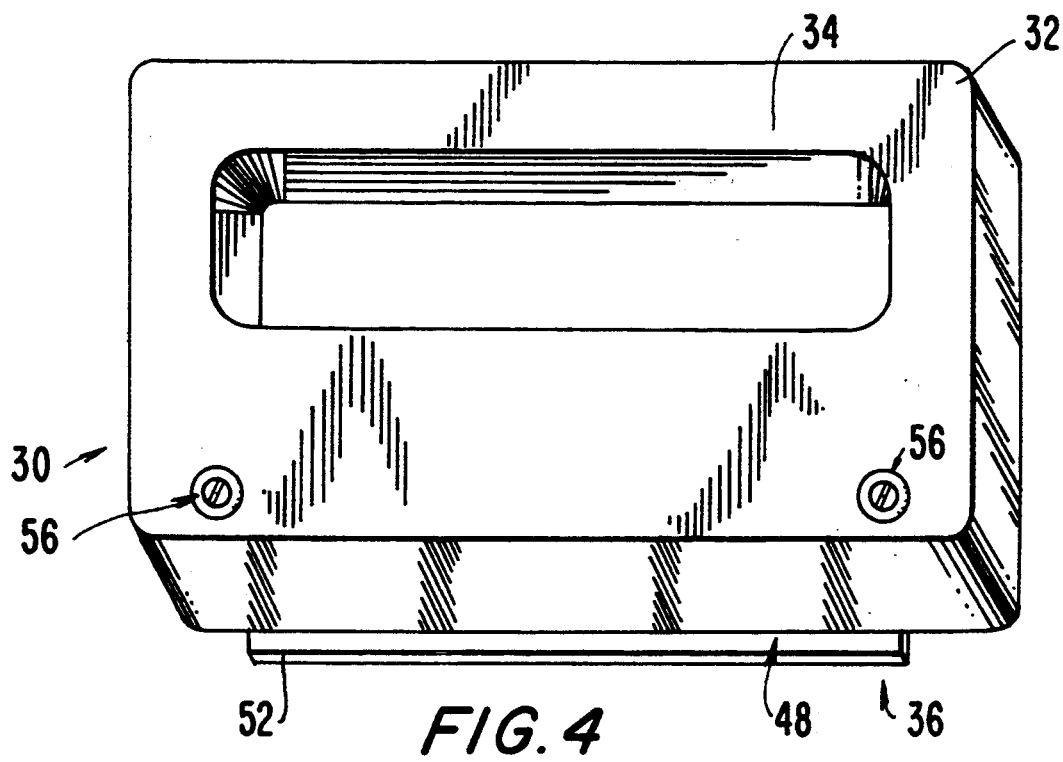
FIG. 4 is a rear perspective view of the taping alignment tool of FIG. 3.
Figure 5:
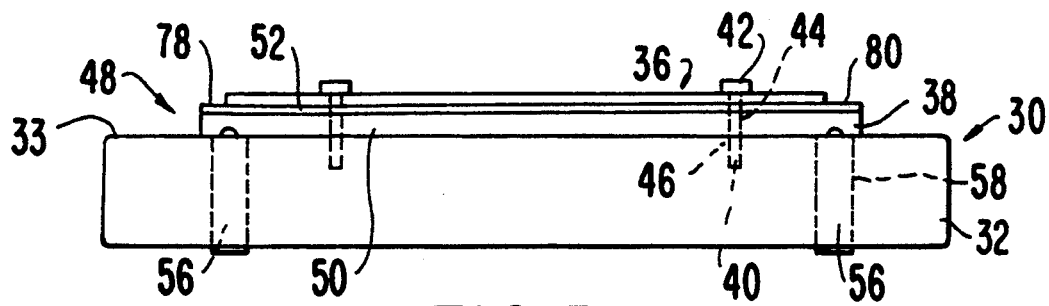
FIG. 5 is a front elevational view of the taping alignment tool of FIG. 3.
Figure 6:
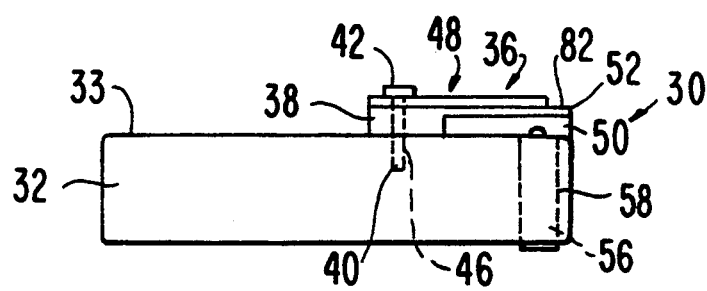
FIG. 6 is an end elevational view of the taping alignment tool of FIG. 3.
Figure 7:
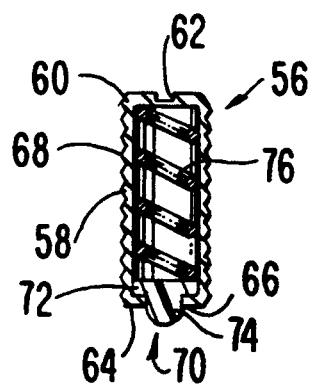
FIG. 7 is a cross-sectional view of one pin assembly of the tape alignment tool for grasping and aligning the printed circuit board.

Referring to the drawings in detail, and initially to FIGS. 1 and 2 thereof, there is shown a conventional printed circuit board 10 formed of a rigid plastic material and having metal edge protectors 12 around its periphery. A circuit wiring pattern 14 (FIG. 2) is formed on printed circuit board 10. Although not shown, it will be appreciated that circuit wiring pattern 14 is or will electrically connected to circuit components mounted on printed circuit board 10.

In addition, printed circuit board 10 has two sets 16 of peripherally located finger connectors 18 for inputting signals to, and for outputting signals from, circuit wiring pattern 14.

Because printed circuit board 10 is attached to and removed from different connections, there is often repeated connection and disconnection of finger connectors 18 to external connections. Because of the need for better electrical connectability and the requirement for low contact resistance, finger connectors 18 are coated with a noble element, such as a gold alloy. An example of such a gold alloy that is used is a cobalt-gold alloy. Further, such gold alloy prevents corrosion of finger connectors 18, and therefore, prevents oxidation thereof.

Therefore, when plating finger connectors 18 with the gold alloy, it is necessary to provide a mask for printed circuit board 10 so that the gold alloy is applied only to finger connectors 18. In this regard, it is know to adhere tape over the peripheral portion of printed circuit board 18, except over that area containing finger connectors 18. As discussed above, this tape adherence operation is performed manually.

However, as shown with the upper set 16 of finger connectors 18 of FIG. 1, three pieces of tape have conventionally been used for masking each side of printed circuit board 10 in connection with a set 16 of finger connectors 18. Specifically, there is one piece of tape 20 below upper set 16 of finger connectors 18 and one piece of tape 22 and 24, respectively, on either side of upper set 16 of finger connectors 18, thereby leaving upper set 16 of finger connectors 18 exposed.

However, because of this operation, alignment of pieces of tape 20, 22 and 24 will vary with each set of finger connectors, and there will not always be correct alignment.

Further, this operation must be performed for both sides of printed circuit board 10 for each set 16 of finger connectors 18. Since there are two sets 16 of finger connectors 18 on printed circuit board 10, twelve pieces of tape must be used, which is wasteful and time consuming to apply.

Referring now to FIGS. 3-7, a taping alignment tool 30 for printed circuit boards, according to the present invention, includes a generally rectangular base 32 having an elongated opening 34 therein which functions as a handle by which a user can grasp and pick up taping alignment tool 30.

A tape alignment and cutting member 36 is secured to base 32. Specifically, tape alignment and cutting member 36 has a generally L-shape, with one leg 38 thereof forming a base leg which is secured to the front surface 33 of base 32, immediately below and parallel to the lower edge of elongated opening 34. As shown, two screws 40 having hex heads 42 extend through openings 44 in base leg 38 and are into threaded openings 46 in base 32.

An extension leg 48 of tape alignment and cutting member 36 extends away from elongated opening 34 in substantially parallel, spaced relation with respect to front surface 33 of base 32, so as to form a groove 50 therebetween. Preferably, the free or lower edge 52 of leg 48 extends to, and is in alignment with, the lower edge of base 32, as shown best in FIG. 6. In this regard, printed circuit board 10 can fit within groove 50.

In order to properly align printed circuit board 10 so that a set 16 of finger connectors 18 is positioned within groove 50, and thereby covered by tape alignment and cutting member 36, printed circuit board 10 is formed with two holes 54 on opposite sides of each set 16 of finger connectors 18, as shown in FIG. 2.

Two spring-loaded pin assemblies 56 are threaded into threaded holes 58 at the rear of base 32, and extend through to the front surface 33 of base 32. Specifically, as shown best in FIG. 7, each pin assembly 56 includes a hollow elongated housing 58 having a closed upper end 60 with a slot 62 therein for a screwdriver (not shown) so as to screw assemblies 56 into holes 58. A lower closure disc 64 having a central hole 66 therein is formed at the lower end of housing 58. Further, screw threads 68 are formed along the outer surface of housing 58.

A spring-loaded pin 70 has a stop 72 inserted within housing 58 and a bulbous end 74 connected with stop 72. Stop 72 has a larger diameter than that of central hole 66 of closure disc 64 so as to always be retained within housing 58, while bulbous end 74 has a diameter less than that of central hole 66 so as to extend out of the lower end of housing 58. A coil spring 76 is positioned within housing 58 so as to normally bias bulbous end 74 out through central hole 66.

Pin assemblies 56 are positioned so as to engage within holes 54 of printed circuit board 10 when the latter is positioned within groove 50 so as to accurately align the set 16 of finger connectors 18 within groove 50.

Tape alignment and cutting member 36 is also cutaway or recessed at the two opposite side edges and at lower edge 52 of upper exposed surface of extension leg 48, to form opposite side edge stepped surfaces 78 and 80 and a lower edge stepped surface 82, respectively, with lower edge stepped surface 82 being continuously formed with side edge stepped surfaces 78 and 80. As will be understood from the discussion which follows, stepped surfaces 78, 80 and 82 are used to accurately cut a piece of tape used for masking printed circuit board 10. Thus, stepped surfaces 78, 80 and 82 form a knife guide means for guiding a knife to cut a piece of tape applied on printed circuit board 10 and extension leg 48, in a pattern around the set 16 of finger connectors 18.

Lastly, two opposite elongated recesses 84 are formed in the upper surface of tape alignment and cutting member 36 between screws 40 and side edges stepped surface 78 and 80, respectively.

In use of taping alignment tool 30, one edge of printed circuit board 10 which contains a set 16 of finger connectors 18 is inserted within groove 50. During this insertion, pins 70 are depressed against the force of coil springs 76. When pins 70 are in alignment with holes 54 in printed circuit board 10, coil springs 76 force pins 70 outwardly into engagement with holes 54 so as to accurately align taping alignment tool 30 with printed circuit board 10. In this position, leg 48 of tape alignment and cutting member 36 is in covering relation to finger connectors 18.

Then, a single piece of tape 86 is positioned over printed circuit board 10 and extension leg 48, as shown at the lower end of FIG. 1. Thereafter, a knife, such as a knife sold under the trademark "EXACTO", is used to cut tape 86 along stepped surfaces 78, 80 and 82. Then, taping alignment tool 30 is removed from printed circuit board 10, and tape 86 is pressed down on printed circuit board 10 around the set 16 of finger connectors 18, thereby masking printed circuit board 10 except in that area defined by finger connectors 18. To aid in removal of tape 86 from the exposed upper surface of extension leg 48, the "EXACTO" knife is inserted into elongated recesses 84 and under tape 86.

It will therefore be appreciated that taping alignment tool accurately aligns tape 86 in connection with each set 16 of finger connectors 18 of printed circuit board 10. Further, only one piece of tape 86 is required to be use for each side of a set 16 of finger connectors 18. As a result, the time for applying tape 86 to printed circuit board 10 is reduced.

Further, various modifications can be made within the scope of the present invention. For example, other forms of the guide means for the knife used to cut tape 86 can be provided. Thus, rather than forming stepped surfaces 78, 80 and 82, a line groove or depression can be formed along the three sides to act as a guide for the knife. In addition, spring-loaded pin assemblies 56 can be eliminated, and in such case, the width of groove 50 can be defined to provide a friction fit with printed circuit board 10. In such case, markings can be provided on printed circuit board 10 for providing accurate alignment thereof. Alternatively, pin assemblies need not be spring loaded, and in such case, printed circuit board 10 can fit within groove 50 by deformation or bending of extension leg 48.

Having described a specific preferred embodiment of the invention with reference to the accompanying drawings, it will be appreciated that the present invention is not limited to that precise embodiment and that various changes and modifications can be effected therein by one of ordinary skill in the art without departing from the scope or spirit of the invention as defined by the appended claims.

What is claimed is:

1. A taping alignment tool for aligning tape on a printed circuit board having a set of finger connectors, said taping alignment tool comprising:
    a base having a first surface;
    a tape alignment and cutting member mounted on said first surface of said base, said tape alignment and cutting member including:
        base leg means for mounting said tape alignment and cutting member on said base, and
        extension leg means, extending from said base leg means in spaced relation above said first surface of said base, for forming a groove between said extension leg means and said first surface of said base to receive the set of finger connectors of the printed circuit board therein, said extension leg means having an exposed surface with guide means therein for guiding a knife to cut the tape applied on the printed circuit board and said extension leg means, in a pattern around said set of finger connectors; and
    securement means for securing said base leg means on said first surface of said base.

2. A taping alignment tool according to claim 1, wherein said tape alignment and cutting member has a generally L-shaped configuration, with said base leg means forming one leg of said L-shaped configuration and said extension leg means forming another leg of said L-shaped configuration.

3. A taping alignment tool according to claim 1, wherein said extension leg means extends substantially parallel to said first surface of said base.

4. A taping alignment tool according to claim 3, wherein said base has a lower edge and said extension leg means has a lower edge substantially in alignment with said lower edge of said base.

5. A taping alignment tool according to claim 1, wherein said guide means includes cut-away portions of said exposed surface of said extension leg means for forming opposite side edge knife guides and a lower edge knife guide.

6. A taping alignment tool according to claim 5, wherein said lower edge knife guide is continuously formed with said side edge knife guides.

7. A taping alignment tool according to claim 5, wherein said side edge knife guides and said lower edge knife guide are in the form of stepped surfaces.

8. A taping alignment tool according to claim 1, wherein said exposed surface of said extension leg means has at least one recess means thereof for aiding in removal of the tape applied to said exposed surface after the tape has been cut.

9. A taping alignment tool according to claim 1, wherein said securement means includes screw means for securing said base leg means to said first surface of said base.

10. A taping alignment tool according to claim 1, wherein said base includes an elongated opening forming a handle therein.

11. A taping alignment tool according to claim 1, wherein there is at least one aligning hole in the printed circuit board adjacent said set of finger connectors, and further including pin means for engaging with said at least one aligning hole of the printed circuit board so as to align the printed circuit board in said groove, said pin means being mounted in said base so as to extend through said first surface into said groove.

12. A taping alignment tool according to claim 11, wherein said pin means includes:
    mounting housing means for mounting said pin means in said base;
    a pin slidably retained within said mounting housing means; and
    spring means, in said mounting housing means, for biasing said pin partially out of said mounting housing means into said groove for engagement with said at least one aligning hole.

13. A taping alignment tool according to claim 12, wherein said base includes a threaded opening, and said mounting housing means includes external threads for threadedly engaging said mounting housing means within said threaded opening of said base.

14. A taping alignment tool according to claim 11, wherein there are two said aligning holes in the printed circuit board, each aligning hole being adjacent a different side of the set of finger connectors; and there are two said pin means, each pin means for engaging with a different one of said aligning holes.

15. A taping alignment tool for aligning tape on a printed circuit board having a set of finger connectors and at least one aligning hole adjacent said set of finger connectors, said taping alignment tool comprising:
    a base having a first surface;
    a tape alignment and cutting member mounted on said first surface of said base, said tape alignment and cutting member including:
        base leg means for mounting said tape alignment and cutting member on said base, and
        extension leg means, extending from said base leg means in spaced relation above said first surface of said base, for forming a groove between said extension leg means and said first surface of said base to receive the set of finger connectors of the printed circuit board therein, said extension leg means having an exposed surface with guide means therein for guiding a knife to cut the tape applied on the printed circuit board and said extension leg means, in a pattern around said set of finger connectors, and said guide means including cut-away portions of said exposed surface of said extension leg means for forming opposite side edge knife guides and a lower edge knife guide;
    securement means for securing said base leg means on said first surface of said base; and
    pin means for engaging with said at least one aligning hole of the printed circuit board so as to align the printed circuit board in said groove, said pin means being mounted in said base so as to extend through said first surface into said groove.

16. A taping alignment tool according to claim 15, wherein said tape alignment and cutting member has a generally L-shaped configuration, with said base leg means forming one leg of said L-shaped configuration and said extension leg means forming another leg of said L-shaped configuration.

17. A taping alignment tool according to claim 15, wherein said extension leg means extends substantially parallel to said first surface of said base.

18. A taping alignment tool according to claim 17, wherein said base has a lower edge and said extension leg means has a lower edge substantially in alignment with said lower edge of said base.

19. A taping alignment tool according to claim 15, wherein said lower edge knife guide is continuously formed with said side edge knife guides.

20. A taping alignment tool according to claim 15, wherein said side edge knife guides and said lower edge knife guide are in the form of stepped surfaces.

21. A taping alignment tool according to claim 15, wherein said exposed surface of said extension leg means has at least one recess means thereof for aiding in removal of the tape from said exposed surface after the tape has been cut.

22. A taping alignment tool according to claim 15, wherein said securement means includes screw means for securing said base leg means to said first surface of said base.

23. A taping alignment tool according to claim 15, wherein said base includes an elongated opening forming a handle therein.

24. A taping alignment tool according to claim 15, wherein said pin means includes:
mounting housing means for mounting said pin means in said base,
a pin slidably retained within said mounting housing means, and
spring means, in said mounting housing means, for biasing said pin partially out of said mounting housing means into said groove for engagement with said at least one aligning hole.

25. A taping alignment tool according to claim 24, wherein said base includes a threaded opening, and said mounting housing means includes external threads for threadedly engaging said mounting housing means within said threaded opening of said base.

26. A taping alignment tool according to claim 15, wherein there are two said aligning holes in the printed circuit board, each aligning hole adjacent a different side of the set of finger connectors and there are two said pin means, each pin means for engaging with a different one of said aligning holes.

27. A taping alignment tool for aligning tape on a printed circuit board having a set of finger connectors and first and second aligning holes adjacent said set of finger connectors at opposite sides thereof, said taping alignment tool comprising:
a base having a first surface;
a tape alignment and cutting member mounted on said first surface of said base, said tape alignment and cutting member including:
base leg means for mounting said tape alignment and cutting member on said base,
extension leg means, extending from said base leg means in substantially parallel, spaced relation above said first surface of said base, for forming a groove between said extension leg means and said first surface of said base to receive the set of finger connectors of the printed circuit board therein, said extension leg means having an exposed surface with guide means therein for guiding a knife to cut the tape applied on the printed circuit board and said extension leg means, in a pattern around said set of finger connectors, and said guide means including cut-away portions of said exposed surface of said extension leg means for forming opposite side edge knife guides and a lower edge knife guide, with said lower edge knife guide being continuously formed with said side edge knife guides, and said exposed surface of said extension leg means has at least one recess means thereof for aiding in removal of the tape from said exposed surface after the tape has been cut, and
said tape alignment and cutting member has a generally L-shaped configuration, with said base leg means forming one leg of said L-shaped configuration and said extension leg means forming another leg of said L-shaped configuration;
securement means for securing said base leg means on said first surface of said base; and
first and second pin means for engaging with said first and second aligning holes, respectively, of the printed circuit board so as to align the printed circuit board in said groove, each said pin means being mounted in said base so as to extend through said first surface into said groove, each said pin means including:
mounting housing means for mounting said pin means in said base,
a pin slidably retained within said mounting housing means, and
spring means, in said mounting housing means, for biasing said pin partially out of said mounting housing means into said groove for engagement with a respective said aligning hole.

28. A taping alignment tool according to claim 27, wherein said side edge knife guides and said lower edge knife guide are in the form of stepped surfaces.

* * * * *